United States Patent
Nakayama et al.

(10) Patent No.: US 9,129,885 B2
(45) Date of Patent: Sep. 8, 2015

(54) POWER SEMICONDUCTOR MODULE

(75) Inventors: Yasushi Nakayama, Tokyo (JP); Takayoshi Miki, Tokyo (JP); Takeshi Oi, Tokyo (JP); Kazuhiro Tada, Tokyo (JP); Shiori Idaka, Tokyo (JP); Shigeru Hasegawa, Tokyo (JP); Takeshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/521,586

(22) PCT Filed: Jan. 12, 2011

(86) PCT No.: PCT/JP2011/000088
§ 371 (c)(1),
(2), (4) Date: Jul. 11, 2012

(87) PCT Pub. No.: WO2011/086896
PCT Pub. Date: Jul. 21, 2011

(65) Prior Publication Data
US 2012/0286292 A1 Nov. 15, 2012

(30) Foreign Application Priority Data
Jan. 15, 2010 (JP) .................................. 2010-006952

(51) Int. Cl.
*H01L 29/24* (2006.01)
*H01L 25/18* (2006.01)
(Continued)

(52) U.S. Cl.
CPC ................ *H01L 25/18* (2013.01); *H01L 23/24* (2013.01); *H01L 23/3135* (2013.01);
(Continued)

(58) Field of Classification Search
CPC .... H01L 25/18; H01L 25/072; H01L 29/1608
USPC .................................................. 257/744, 77
See application file for complete search history.

(56) References Cited

U.S. PATENT DOCUMENTS 6,654,260 B2 * 11/2003 Okayama et al. ............... 363/37
6,967,357 B1 * 11/2005 Kon et al. ...................... 257/133
(Continued)

FOREIGN PATENT DOCUMENTS

JP       3 126055      12/1991
JP       11-274482     10/1999
(Continued)

OTHER PUBLICATIONS

Office Action issued Jun. 12, 2012 in Japanese Patent Application No. 2011-549927 with English translation.
(Continued)

*Primary Examiner* — Eugene Lee
(74) *Attorney, Agent, or Firm* — Oblon, McClelland, Maier & Neustadt, L.L.P.

(57) ABSTRACT

A power semiconductor module in which temperature rise of switching elements made of a Si semiconductor can be suppressed low and efficiency of cooling the module can be enhanced. To that end, the power semiconductor module includes switching elements made of the Si semiconductor and diodes made of a wide-bandgap semiconductor, the diodes are arranged in the middle region of the power semiconductor module, and the switching elements are arranged in both sides or in the periphery of the middle region of the power semiconductor module.

20 Claims, 6 Drawing Sheets

(51) Int. Cl.
- *H01L 23/24* (2006.01)
- *H01L 23/31* (2006.01)
- *H01L 23/373* (2006.01)
- *H01L 25/07* (2006.01)
- H01L 29/16 (2006.01)
- H01L 23/00 (2006.01)

(52) U.S. Cl.
CPC ......... *H01L 23/3735* (2013.01); *H01L 25/072* (2013.01); *H01L 24/48* (2013.01); *H01L 24/49* (2013.01); *H01L 29/1608* (2013.01); *H01L 2224/48091* (2013.01); *H01L 2224/48137* (2013.01); *H01L 2224/48227* (2013.01); *H01L 2224/49111* (2013.01); *H01L 2224/49175* (2013.01); *H01L 2924/01004* (2013.01); *H01L 2924/1033* (2013.01); *H01L 2924/10253* (2013.01); *H01L 2924/10254* (2013.01); *H01L 2924/10272* (2013.01); *H01L 2924/12031* (2013.01); *H01L 2924/12032* (2013.01); *H01L 2924/1305* (2013.01); *H01L 2924/13055* (2013.01); *H01L 2924/13091* (2013.01); *H01L 2924/15311* (2013.01); *H01L 2924/19107* (2013.01)

(56) References Cited

U.S. PATENT DOCUMENTS

| | | | |
|---|---|---|---|
| 7,034,345 B2 * | 4/2006 | Chang et al. | 257/177 |
| 7,230,273 B2 * | 6/2007 | Kitabatake et al. | 257/76 |
| 7,755,898 B2 | 7/2010 | Aoki et al. | |
| 2002/0167825 A1 | 11/2002 | Okayama et al. | |
| 2002/0167828 A1 | 11/2002 | Parkhill et al. | |
| 2002/0190374 A1 * | 12/2002 | Nakajima et al. | 257/707 |
| 2004/0188706 A1 | 9/2004 | Chang et al. | |
| 2004/0228094 A1 * | 11/2004 | Ahmed et al. | 361/702 |
| 2007/0193763 A1 * | 8/2007 | Parkhill et al. | 174/32 |
| 2008/0105896 A1 * | 5/2008 | Kawaguchi et al. | 257/177 |
| 2008/0291710 A1 | 11/2008 | Aoki et al. | |
| 2009/0058500 A1 * | 3/2009 | Osawa et al. | 327/434 |
| 2009/0085219 A1 * | 4/2009 | Bayerer | 257/776 |
| 2009/0200657 A1 * | 8/2009 | Liu et al. | 257/691 |
| 2010/0244092 A1 * | 9/2010 | Ishikawa et al. | 257/140 |
| 2011/0049535 A1 | 3/2011 | Soeno | |

FOREIGN PATENT DOCUMENTS

| | | |
|---|---|---|
| JP | 2000 311972 | 11/2000 |
| JP | 2000-311972 | 11/2000 |
| JP | 2004 095670 | 3/2004 |
| JP | 2009 272482 | 11/2009 |
| JP | 2009-272482 | 11/2009 |
| JP | 2010-232576 | 10/2010 |
| JP | 2010 232576 | 10/2010 |
| WO | 2008 142885 | 11/2008 |
| WO | WO 2008/142885 A1 | 11/2008 |

OTHER PUBLICATIONS

Extended European Search Report issued Dec. 4, 2013 in Patent Application No. 11732771.8.

Office Action issued Aug. 21, 2013 in Korean Patent Application No. 2012-7017998 with English language translation.

U.S. Appl. No. 14/131,581, filed Jan. 8, 2014, Miki, et al.

International Search Report Issued Mar. 22, 2011 in PCT/JP11/00088 Filed Jan. 12, 2011.

Combined Chinese Office Action and Search Report issued Apr. 30, 2014 in Patent Application No. 201180005358.8 with English language translation and English Translation of Category of Cited Documents.

Chinese Office Action issued Dec. 10, 2014 in Chinese Patent Application No. 201180005358.8 (with English translation of relevant portions thereof).

European Notification of Communication issued Feb. 19, 2015 in for European Patent Application No. 11 732 771.8.

\* cited by examiner

POWER SEMICONDUCTOR MODULE

TECHNICAL FIELD

The present invention relates to power semiconductor modules incorporating switching elements and diodes connected antiparallel to the switching elements.

BACKGROUND ART

Power semiconductor modules incorporating switching elements and diodes connected antiparallel to the switching elements are widely used for power converters that perform conversions such as a DC-AC and DC-DC conversion. A Si (silicon) semiconductor has been conventionally used for switching elements and diodes; however applications of a wide-bandgap semiconductor, which is represented by a SiC (silicon carbide) semiconductor, have been developed in recent years. The SiC semiconductor features low power loss, operability at high temperatures, high-withstand voltage, etc. compared to the Si semiconductor; therefore using the SiC semiconductor enables reduction in size and power loss of a semiconductor module, and in addition it enables not only reduction in size of cooling unit to which the power semiconductor module is mounted, but also improvement in efficiency of a power inverter using the power semiconductor module.

Using the SiC semiconductor for both switching elements and diodes will further enhance the effect as described above. However, the construction of the switching elements is complex compared to that of the diodes, so there also remains manufacturing problems in using the SiC semiconductor for the switching elements. Therefore, there has been proposed a semiconductor module in which using the Si semiconductor for the switching elements and the SiC semiconductor only for the diodes, the Si switching elements and SiC diodes are arranged on the same metal base (refer to, for example, Patent Document 1).

PRIOR ART DOCUMENT

Patent Document

Patent Document 1: Japanese Laid-Open Patent Publication No. 2004-95670 (pp. 10-11, FIG. 8)

DISCLOSURE OF THE INVENTION

Problem to be Solved by the Invention

When Si switching elements and SiC diodes are arranged in the same power semiconductor module, since the SiC diodes have power loss lower than that of the Si switching elements and can be operated at high temperatures, they must be configured and arranged in a thermally optimal way, taking their properties into consideration. In the conventional semiconductor module shown in Patent Document 1, the Si switching elements and SiC diodes are arranged separately in the right and left sides. Although the Si switching elements and SiC diodes are arranged on separate insulating substrates, the problem has been that when a plurality of Si switching elements are arranged, the Si switching elements thermally interfere with each other, and thereby the temperature of Si switching elements arranged in the middle region of the power semiconductor module is likely to rise.

The present invention has been made aiming at solving the foregoing problem, which provides a power semiconductor module in which when the switching elements made of the Si semiconductor and diodes made of the wide-bandgap semiconductor that can be used at higher temperatures are arranged inside the same power semiconductor module, temperature rise of the switching elements made of the Si semiconductor can be suppressed low, thereby achieving high cooling efficiency.

Means for Solving the Problem

A power semiconductor module according to the present invention comprises Si semiconductor elements and wide-bandgap semiconductor elements, wherein the wide-bandgap semiconductor elements are arranged in the middle region of the power semiconductor module, and the Si semiconductor elements are arranged in both sides or in the periphery of the middle region.

Advantage of the Invention

In a power semiconductor module according to the present invention, since the wide-bandgap semiconductor elements are arranged in the middle region of the power semiconductor module, and the Si semiconductor elements are arranged in both sides or in the periphery of the middle region, temperature rise of the Si semiconductor switching elements can be suppressed low, so that cooling efficiency of the power semiconductor module can be enhanced.

BEST MODE FOR CARRYING OUT THE INVENTION

Embodiment 1.

Figure 1:
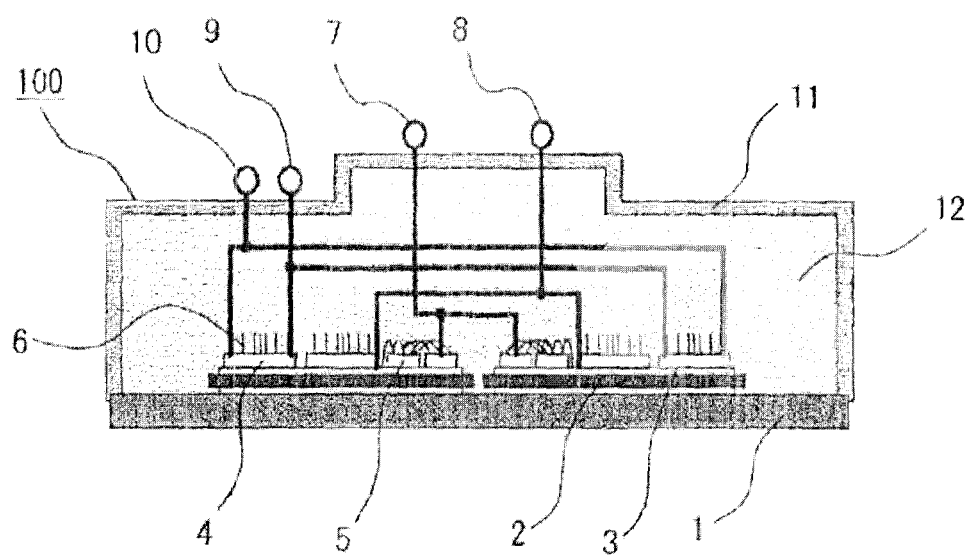
FIG. 1 is a cross-sectional view of a power semiconductor module according to Embodiment 1 of the present invention.

FIG. 1 is a cross-sectional view of a power semiconductor module according to Embodiment 1 to embody the present invention: a view showing a simplified cross section of the power semiconductor module. In FIG. 1, the power semiconductor module 100 includes a base plate 1, insulating substrates 2, conductive patterns 3, Si switching elements 4 made of a Si semiconductor, SiC diodes 5 made of a SiC semiconductor that is a wide-bandgap semiconductor, wirings 6, main electrodes 7 and 8, control terminals 9 and 10, a case 11, and an insulating encapsulant 12. The Si switching elements 4 are Si semiconductor elements; the SiC diodes 5 are wide-bandgap semiconductor elements.

The base plate 1 serves to fix the power semiconductor module 100 to an external cooling unit; a not-shown cooling unit is fixed from outside to one of the faces of the base plate 1 (bottom side in FIG. 1). Heat generated in the power semiconductor module 100 is dissipated to outside through the base plate 1. On the other face of the base plate 1 (top side in FIG. 1) are installed the insulating substrates 2 using solder and the like. One of the faces of the insulating substrates 2 (bottom side in FIG. 1) is the face to be attached to the base plate 1; on the other face of the insulating substrates 2 (top side in FIG. 1) are formed the conductive patterns 3 that serve as current paths.

The Si switching elements 4 and SiC diodes 5 are mounted on the conductive patterns 3. The Si switching elements 4 may be semiconductor elements that can be turned on/off in a controlled manner, so, for example, IGBTs (insulated gate bipolar transistors) and MOSFETs (metal-oxide semiconductor field-effect transistors) are used. Moreover, for example, Schottky barrier diodes, PIN (positive intrinsic negative) diodes, etc. are used as the SIC diodes 5.

The Si switching elements 4 and SiC diodes 5 are electrically connected antiparallel with each other; when the IGBTs are used for the Si switching elements 4, for example, the collector of the IGBTs is electrically connected with the cathode of the SiC diodes 5 via the conductive patterns 3. The Si switching elements 4 and SiC diodes 5 are provided with the wirings 6, and connected to the main electrodes 7 and 8 and the control terminals 9 and 10 via the conductive patterns 3 and wirings 6. The main electrodes 7 and 8 are connected to a not-shown external circuit, which constitutes the main circuit of a power inverter and the like. A control signal to control the Si switching elements 4 to turn on/off is supplied to the control terminals 9 and 10 from the external circuit. Incidentally, the main electrodes 7 and 8 and the control terminals 9 and 10 are simplified and illustrated in FIG. 1 so that the internal construction of the power semiconductor modules can be easily grasped.

Parts such as the Si switching elements 4 and SiC diodes 5 that constitute the power semiconductor module 100 are housed in the case 11. Furthermore, the case 11 is filled with the insulating encapsulant 12 to keep the interior of the power semiconductor module 100 insulated.

Figure 2:
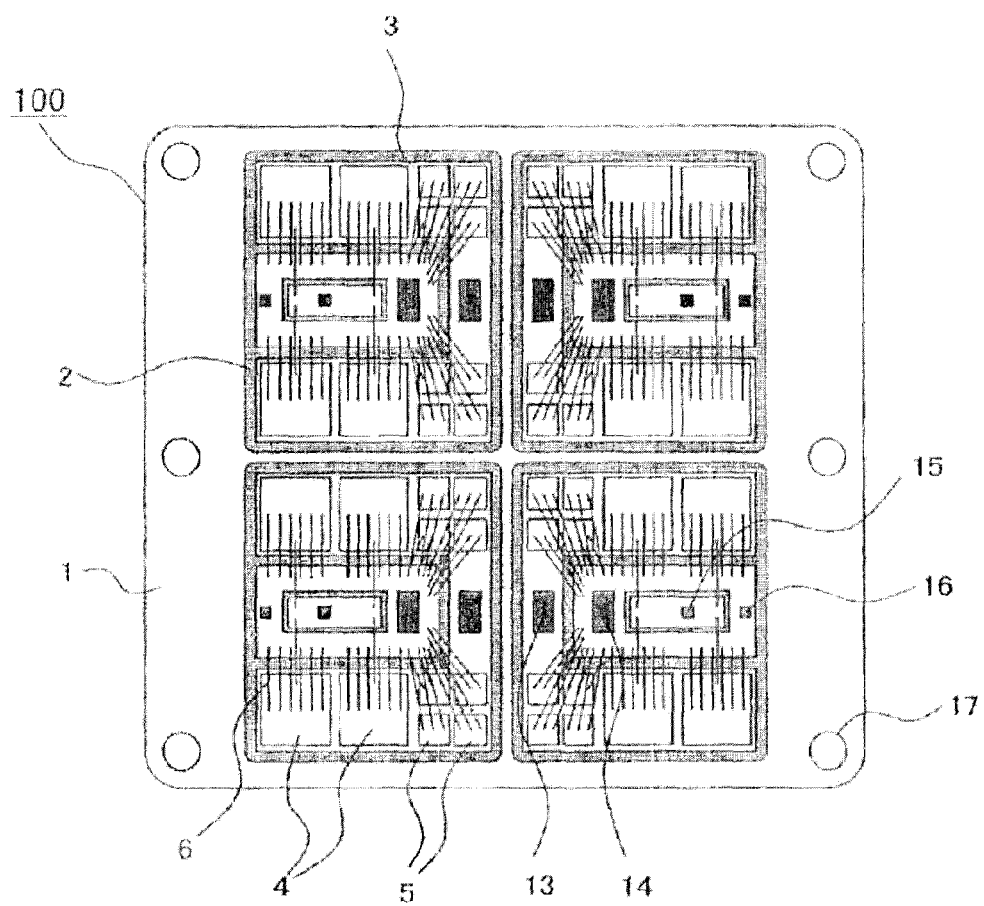
FIG. 2 is a top view showing an internal arrangement of the power semiconductor module according to Embodiment 1 of the present invention.

FIG. 2 is a top view showing an internal arrangement of the power semiconductor module when the power semiconductor module 100 is viewed from the upper side with the main electrodes 7 and 8, the control terminals 9 and 10, the case 11 and the insulating encapsulant 12 removed. In FIG. 2, those with the same reference numerals as FIG. 1 are the same or corresponding parts, and this applies to the whole of this description.

The main electrode 7 shown in FIG. 1 is connected to a main electrode anchoring point 13 on the conductive patterns 3; the main electrode 8 and control terminals 9 and 10 are connected to a main electrode anchoring point 14 and control terminal anchoring points 15 and 16, respectively, which are electrically connected to the Si switching elements 4 and SiC diodes 5 via the conductive patterns 3 and wirings 6. Moreover, fixing holes 17 are made in the base plate 1, and the power semiconductor module 100 is mounted to an external cooling unit and the like using the fixing holes 17.

A plurality of the Si switching elements 4 and plurality of the SiC diodes 5 are arranged in the power semiconductor module 100 (16 Si switching elements 4 and 32 SiC diodes 5 in FIG. 2). In FIG. 2, the plurality of the SiC diodes 5 are arranged together in the middle region of the power semiconductor module 100. The middle region of this Embodiment means, viewed from the upper side of the power semiconductor module 100, a strip region dividing the module into the right and left. The plurality of the Si switching elements 4 are arranged separately in both sides of this middle region (arranged in both sides of the semiconductor module 100). That is to say, the SiC diodes 5 are arranged as sandwiched between pluralities of the Si switching elements 4. As an example, the Si switching elements 4 are arranged in eights in their respective sides of the power semiconductor module 100, and the 32 SiC diodes 5 are arranged therebetween.

In general, when a plurality of semiconductor elements such as switching elements and diodes are mounted in the same power semiconductor module, even if power loss in each semiconductor element is the same, semiconductor elements mounted in the middle region of the power semiconductor module are difficult to dissipate heat, thereby easily raising their temperature. On the other hand, switching elements mounted in both sides or in the periphery of the power semiconductor module can easily dissipate heat, so that the temperature thereof is difficult to rise. Therefore, there arises a problem in that when diodes are made of the same Si semiconductor as the switching elements, for example, and arranged in the middle region of the power semiconductor module, the temperature of the diodes rises too much. However, since SiC diodes feature low power loss, even if the SiC diodes 5 are arranged in the middle region of the power semiconductor module 100, the same as this Embodiment, temperature rise can be suppressed. In addition, since the SiC diodes 5 can be used at high temperatures, even if the diodes are arranged in the middle region where temperature easily rises, the diodes can be operated properly. Furthermore, since the Si switching elements 4 are arranged in both sides of the middle region, heat from the Si switching elements 4 can be easily dissipated, so that temperature rise thereof can be suppressed. Therefore, for example, the cooling unit to be provided outside is reduced in size and the area where the Si switching elements 4 are arranged is made smaller, whereby the power semiconductor module 100 can be reduced in size of its own.

Incidentally, the SiC diodes 5 feature usability at high temperatures; therefore when the diodes are used at high temperatures, there is such an advantage as the region where the diodes are arranged can be reduced in size. However, the diodes are not necessarily used at high temperatures, but may be used in the same temperature range as the Si switching elements 4. Even so, since power loss in the diodes is low, they can be arranged in the middle region of the power semiconductor module 100. Moreover, as to materials used in the periphery of the diodes, such as the insulating encapsulant and solder, materials that can be used in the same temperature range as the Si switching elements 4 become available. Furthermore, since the diodes are not operated up to high temperatures, reliability for heat cycle will also be enhanced.

Moreover, since the SiC diodes 5 are arranged in the middle region of the power semiconductor module 100, and the Si switching elements 4 are arranged in both sides thereof, heat dissipation from the SiC diodes 5 decreases, but that from the Si switching elements 4 increases. Therefore, there is no need to provide any special cooling unit that enhances cooling capability just under the Si switching elements 4 better than that just under the SiC diodes 5 in order to enhance heat dissipation capability of the Si switching elements 4 better than that of the SiC diodes 5, and both can be used in their respective usable temperature ranges, so that versatility can be enhanced.

In the power semiconductor module 100 according to this Embodiment, the Si switching elements 4 and SiC diodes 5 are arranged on the same base plate 1 and insulating substrates 2. When the Si switching elements 4 and SiC diodes 5 are arranged on separate base plates and insulating substrates, there is an advantage that thermal interference effect can be suppressed. However, it is conceivable that operation conditions under which loss in the switching elements increases sometimes differ from those under which loss in the diodes increases. For example, when the power semiconductor module is used as an inverter for driving a motor, turning-on periods of the switching elements are longer than those of the diodes in power running in which energy is supplied from the inverter side to the motor side, so that the loss in the switching elements will increase, whereas in regenerative running in which energy is supplied from the motor side to the inverter side, turning-on periods of the diodes are longer than those of the switching elements, so that the loss in the diodes will increase.

Therefore, under the conditions under which the loss in the Si switching elements 4 is greater than that in the SiC diodes 5, thermal interference effect from the SiC diodes 5 is small, and the Si switching elements 4 can dissipate heat through the entire insulating substrates 2 and the base plate 1; therefore, arranging both the Si switching elements 4 and SiC diodes 5 on the same base plate 1 and same insulating substrates 2 would enhance the heat dissipation capability of the power semiconductor module 100 as a whole. Moreover, arranging the Si switching elements 4 and SiC diodes 5 on the same base plate 1 and insulating substrates 2 would bring about an advantage of reducing the number of parts and easing wirings as well.

The configuration of the power semiconductor module according to this Embodiment is just an example. The SiC diodes 5 only have to be in the middle region of the power semiconductor module 100, and the Si switching elements 4 only have to be arranged in both sides of the middle region; therefore, there is no specific restriction to the arrangement and the like of other parts constituting the power semiconductor module 100. As to the connection of the Si switching elements 4 and SiC diodes 5 with the main electrodes 7 and 8 and the control terminals 9 and 10, for example, the switching elements and diodes only have to be electrically connected, so they may be directly connected to the main electrodes 7 and 8 by wirings, or may be connected using a bus-bar instead of the wirings. In those cases, although the arrangement of the Si switching elements 4 and SiC diodes inside the power semiconductor module 100 is likely to be more or less changed, the SiC diodes 5 and Si switching elements 4 only have to be arranged in the middle region of the power semiconductor module 100 and in both sides of the middle region, respectively.

As described above, the SiC diodes 5 made of the SiC semiconductor that is a wide-bandgap semiconductor featuring low power loss and usability at high temperatures are arranged in the middle region of the power semiconductor module 100 where temperature is easy to rise, and the Si switching elements 4 made of a Si semiconductor are arranged in both sides of the power semiconductor module 100 where temperature is difficult to rise; therefore, temperature rise of the Si switching elements 4 can be suppressed low, so that cooling efficiency of the power semiconductor module 100 can be enhanced.

Incidentally, a case has been explained in this Embodiment in which the SiC diodes 5 are arranged in the middle region of the power semiconductor module 100, and the Si switching elements 4 are arranged in both sides of the power semiconductor module 100. However, using SiC switching elements made of the SiC semiconductor and Si diodes made of the Si semiconductor, the SiC switching elements may be arranged in the middle region of the power semiconductor module, and the Si diodes may be arranged in both sides of the power semiconductor. The conductive patterns, the wirings, the main electrodes, the control terminals, etc. in this case are properly arranged depending on the arrangement of the SiC switching elements and Si diodes. As described above, the SiC switching elements made of the wide-bandgap semiconductor featuring low power loss and usability at high temperatures are arranged in the middle region of the power semiconductor module where temperature is easy to rise, and the Si diodes are arranged in both sides of the power semiconductor module where temperature is difficult to rise; therefore, temperature rise of the Si diodes can be suppressed low, so that cooling efficiency of the power semiconductor module can be enhanced.

Embodiment 2.

Figure 3:
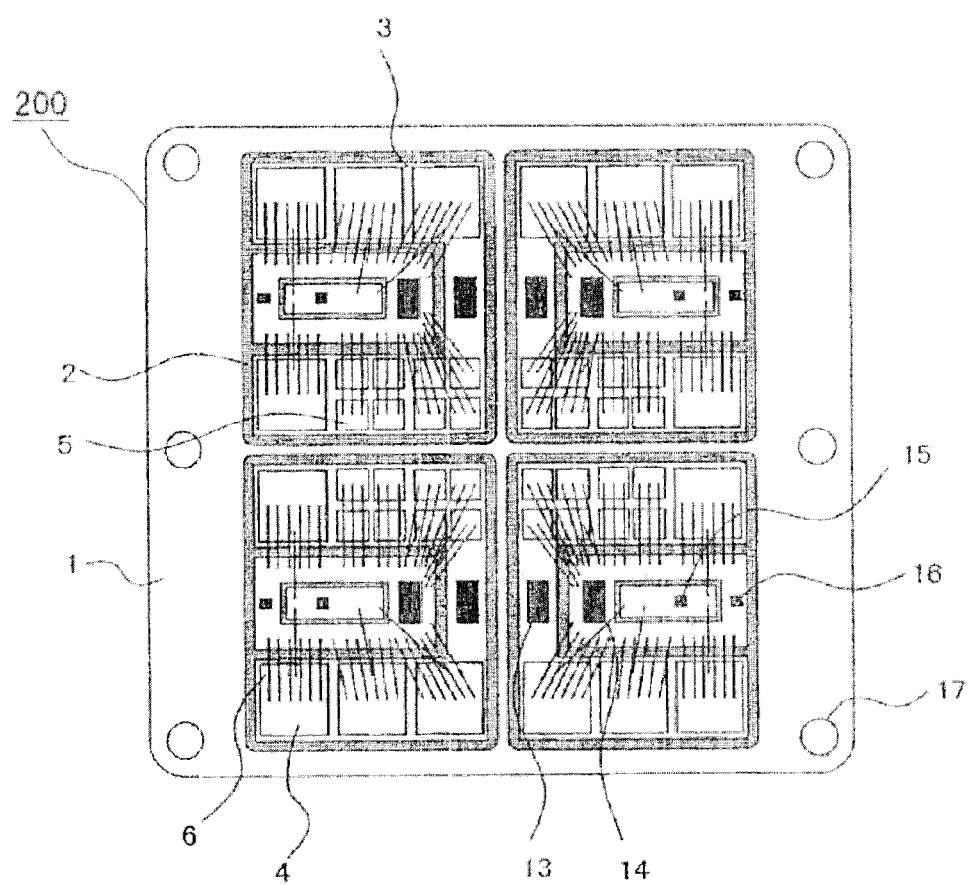
FIG. 3 is a top view showing an internal arrangement of a power semiconductor module according to Embodiment 2 of the present invention.

FIG. 3 is a top view showing an internal arrangement of a power semiconductor module according to Embodiment 2 to embody this invention. This is a figure of the power semiconductor module 200 being viewed from the upper side, the same as FIG. 2, with the main electrodes, the control terminals, the case and the insulating encapsulant removed. In Embodiment 1, the SiC diodes 5 are arranged in the middle region of the power semiconductor module 100, and the Si switching elements 4 are arranged in both sides of the middle region; however, this Embodiment differs from Embodiment 1 in that the Si switching elements 4 are arranged in the periphery surrounding the middle region (arranged in the periphery of the power semiconductor module 200).

A plurality of the Si switching elements 4 and a plurality of the SiC diodes 5 are arranged in the power semiconductor module 200 (16 Si switching elements 4 and 32 SiC diodes 5 in FIG. 3). In FIG. 3, the plurality of the SiC diodes 5 are arranged together in the middle region of the power semiconductor module 200. The middle region in this Embodiment means the center region when the power semiconductor module 200 is viewed from the upper side. The plurality of the Si switching elements 4 are arranged in the periphery surrounding this middle region. That is to say, the SiC diodes 5 are arranged in the middle region of the power semiconductor module 200, as surrounded by the Si switching elements 4. As an example, the 16 Si switching elements 4 are arranged in FIG. 3 as forming the perimeter, and the 32 SiC diodes 5 are arranged as surrounded by the 16 Si switching elements 4. Incidentally, wiring patterns such as the wirings 6 are also modified depending on the arrangement change of the Si switching elements 4 and SiC diodes 5.

According to this Embodiment, since the SiC diodes 5 featuring low power loss and usability at high temperatures are employed, the SiC diodes can be arranged in the middle region of the power semiconductor module 200, and all of the Si switching elements 4 can be arranged in the periphery of the middle region. Therefore, the heat dissipation capability of the Si switching elements 4 can be further enhanced compared to the configuration of Embodiment 1, so that temperature rise of the Si switching elements 4 can be suppressed. Incidentally, although the SiC diodes 5 feature usability at high temperatures, the diodes are not necessarily used at high temperatures, but may be used in the same temperature range as the Si switching elements 4.

The configuration of the power semiconductor module according to this Embodiment is just an example. The SiC diodes 5 only have to be arranged in the middle region of the power semiconductor module 200, and the Si switching elements 4 only have to be arranged in the periphery surrounding the middle region; therefore, the same as Embodiment 1, there is no specific restriction to the arrangement and the like of other parts constituting the power semiconductor module 200. For example, as to the connection of the Si switching elements 4 and SiC diodes 5 with the main electrodes 7 and 8 and the control terminals 9 and 10, the switching elements and diodes only have to be electrically connected, so they may be directly connected to the main electrodes 7 and 8 by wirings, or may be connected using a bus-bar instead of the wirings. In those cases, although the arrangement of the Si switching elements 4 and SiC diodes 5 inside the power semiconductor module 200 is likely to be more or less changed, the SiC diodes only have to be arranged in the middle region of the power semiconductor module 200, and the Si switching elements 4 only have to be arranged in the periphery surrounding the middle region.

As described above, the SiC diodes 5 made of the SiC semiconductor that is a wide-bandgap semiconductor featuring low power loss and usability at high temperatures are arranged in the middle region of the power semiconductor module 200 where temperature is easy to rise, and the Si switching elements 4 made of the Si semiconductor are arranged in the periphery of the power semiconductor module 200 where temperature is difficult to rise; therefore, temperature rise of the Si switching elements 4 can be suppressed low, so that cooling efficiency of the power semiconductor module 200 can be enhanced.

Incidentally, a case has been explained in this Embodiment in which the SiC diodes 5 are arranged in the middle region of the power semiconductor module 200 and the Si switching elements 4 are arranged in the periphery of the power semiconductor module 200. However, using the SiC switching elements made of the SiC semiconductor and the Si diodes made of the Si semiconductor, the SiC switching elements may be arranged in the middle region of the power semiconductor module, and the Si diodes may be arranged in the periphery of the power semiconductor. In this case, the conductive patterns, the wirings, the main electrodes, the control terminals, etc. are properly arranged depending on the arrangement of the SiC switching elements and Si diodes. As described above, the SiC switching elements made of the wide-bandgap semiconductor featuring low power loss and usability at high temperatures are arranged in the middle region of the power semiconductor module where temperature is easy to rise, and the Si diodes are arranged in the periphery of the power semiconductor module where temperature is difficult to rise; therefore, temperature rise of the Si diodes can be suppressed low, so that cooling efficiency of the power semiconductor module can be enhanced.

Embodiment 3.

Figure 4:
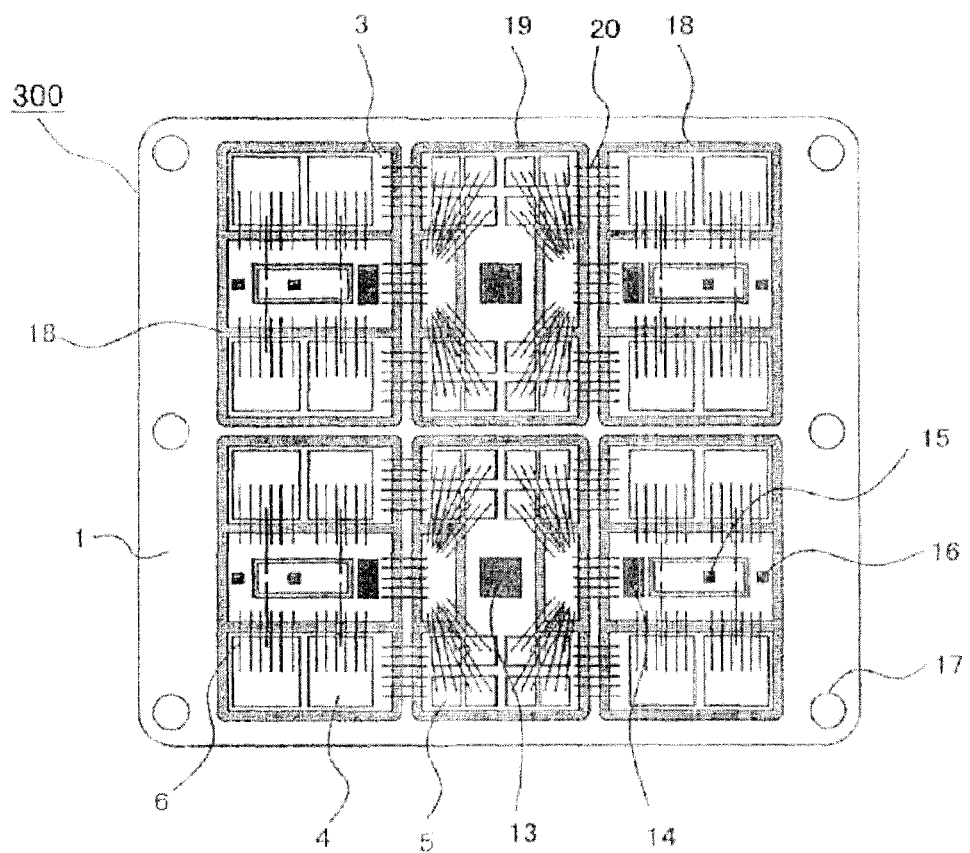
FIG. 4 is a top view showing an internal arrangement of a power semiconductor module according to Embodiment 3 of the present invention.

FIG. 4 is a top view showing an internal arrangement of a power semiconductor module according to Embodiment 3 to embody this invention. The same as FIG. 2, this is a view of the power semiconductor module 300 being viewed from the upper side with the main electrodes, the control terminals, the case and the insulating encapsulant removed. This Embodiment differs from Embodiment 1 in that the Si switching elements 4 and SiC diodes 5 are mounted separately on insulating substrates 18 and insulating substrates 19. The Si switching elements 4 and SiC diodes 5 are mounted separately on the substrates 18 for the switching elements and the substrates 19 for the diodes, respectively. Moreover, since the Si switching elements 4 and SiC diodes 5 are mounted separately on the substrates 18 and substrates 19, respectively, extra wirings 20 are provided to connect the conductive patterns on the substrates 18 for the switching elements with those on the substrates 19 for the diodes. Incidentally, the switching elements and diodes only have to be electrically connected even without using the wirings, so they may be directly connected to the main electrodes 7 and 8 by other wirings, for example, or may be connected using a bus-bar instead of the wirings.

When the Si switching elements 4 and SiC diodes 5 are mounted on the same insulating substrates 2, as in the power semiconductor modules of Embodiments 1 and 2, if the Si switching elements 4 and SiC diodes 5 are operated under conditions of generating heat at the same time, their temperature rises due to thermal interference between the Si switching elements 4 and SiC diodes 5. This Embodiment aims at relieving a thermal interference effect such as the above. Since the Si switching elements 4 and SiC diodes 5 are mounted separately on the substrates 18 and substrates 19, respectively, the Si switching elements 4 become difficult to undergo the thermal interference effect from the SiC diodes 5, so that temperature rise of the Si switching elements 4 can be suppressed.

Incidentally, the substrates 18 for the switching elements and the substrates 19 for the diodes may be made of the same material, or when the SiC diodes 5 are used at high temperatures, different materials may be used taking into consideration their heat resistance and heat-cycle properties.

As described above, since the Si switching elements 4 and SiC diodes 5 are mounted separately on the insulating substrates 18 and substrates 19, the Si switching elements become difficult to undergo the thermal interference effect from the SiC diodes 5, so that temperature rise of the Si switching elements 4 can be suppressed.

Embodiment 4.

Figure 5:
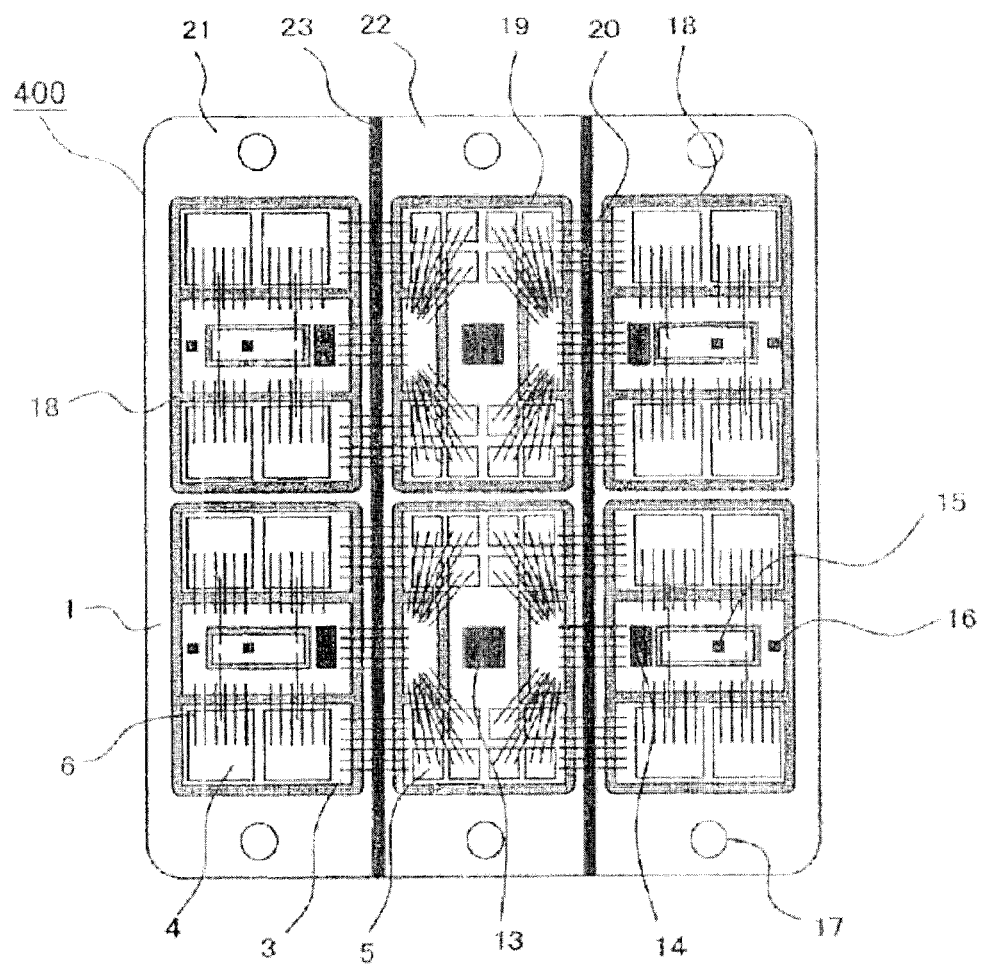
FIG. 5 is a top view showing an internal arrangement of a power semiconductor module according to Embodiment 4 of the present invention.

FIG. 5 is a cross-sectional view of a power semiconductor module according to Embodiment 4 to embody this invention: a view showing a simplified cross section of the power semiconductor module. The same as FIG. 2, this is a view of the power semiconductor module 400 being viewed from the upper side with the main electrodes, the control terminals, the case and the insulating encapsulant removed. This Embodiment differs from Embodiment 3 in that the insulating substrates 18 for switching elements on which the Si switching elements 4 are mounted and the insulating substrates 19 for diodes on which the SiC diodes 5 are mounted are separately installed on the base plates 21 and base plate 22, respectively. The insulating substrates 18 for switching elements on which the Si switching elements 4 are mounted are installed on the base plates 21 for switching elements, and the insulating substrates 19 for diodes on which the SiC diodes 5 are mounted are installed on the base plate 22 for diodes. In FIG. 5, the base plates 21 for switching elements are arranged in both sides of the base plate 22 for diodes. The base plates 21 for switching elements and the base plate 22 for diodes are joined with each other with a heat-insulating material 23 such as resin. Moreover, holes are made in each of the base plates 21 and base plate 22.

When the Si switching elements 4 and SiC diodes 5 are mounted on the same base plate 1, as in the power semiconductor modules of Embodiments 1 to 3, if the Si switching elements 4 and SiC diodes 5 are operated under conditions of generating heat at the same time, their temperature rises due to the thermal interference between the Si switching elements 4 and SiC diodes 5. This Embodiment aims at relieving the foregoing thermal interference effect. Since the Si switching elements 4 and SiC diodes 5 are mounted separately on the base plates 21 and base plate 22, respectively, the Si switching elements 4 become difficult to undergo the thermal interference effect from the SiC diodes 5, so that temperature rise of the Si switching elements 4 can be further suppressed compared to the power semiconductor module 300 shown in Embodiment 3.

As described above, since the Si switching elements 4 and SiC diodes 5 are mounted separately on the base plates 21 and base plate 22, respectively, the Si switching elements 4 become difficult to undergo the thermal interference effect from the SiC diodes 5, so that temperature rise of the Si switching elements 4 can be suppressed.

Embodiment 5.

Figure 6:
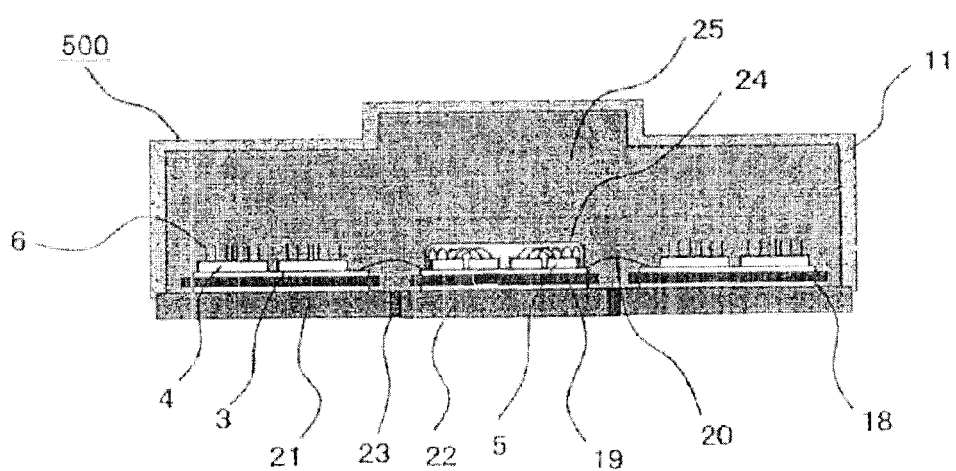
FIG. 6 is a cross-sectional view of a power semiconductor module according to Embodiment 5 of the present invention.

FIG. 6 is a cross-sectional view of a power semiconductor module according to Embodiment 5 to embody this invention: a view showing a simplified cross section of the power semiconductor module. The main electrodes and control terminals are not shown in FIG. 6. The power semiconductor module 500 according to this Embodiment differs from those according to Embodiments 1 to 4 in that the case 11 is filled with two different kinds of insulating encapsulants, instead of just one kind, which are a high-heat-resistant insulating encapsulant 24 and a low-heat-resistant insulating encapsulant 25. The high-heat-resistant insulating encapsulant 24 is used for the periphery of the SiC diodes 5; meanwhile, for other portions including the periphery of the Si switching elements is used the low-heat-resistant insulating encapsulant 25 whose heat resistance is lower than that of the high-heat-resistant insulating encapsulant 24.

As the high-heat-resistant insulating encapsulant 24 can be used, for example, fluorocarbon resin, polyimide, polyamide, epoxy, and in addition silicone resin whose heat resistance is enhanced by increasing its crosslink density or adding metal oxide. Silicone gel, silicone rubber or the like can be used as the low-heat-resistant insulating encapsulant 25. The high-heat-resistant insulating encapsulant 24 preferably covers the SiC diodes 5 and the wirings 6 that are connected to the SIC diodes 5, and in order to secure reliability for heat cycle, the wirings preferably do not straddle the two different kinds of the insulating encapsulants 24 and 25.

By using the high-heat-resistant insulating encapsulant 24 for the periphery of the SiC diodes 5 as described above, the SiC diodes 5 can be operated up to high temperatures. Moreover, although the low-heat-resistant insulating encapsulant 25 is used for other portions including the periphery of the Si switching elements 4, since the low-heat-resistant insulating encapsulant 25 is cheaper than the high-heat-resistant insulating encapsulant 24, manufacturing cost can be reduced compared to only using the high-heat-resistant insulating encapsulant 24. Moreover, it is sometimes difficult to form a thick film depending on high-heat-resistant insulating encapsulants, such as fluorocarbon resin, polyimide and polyamide. By restricting use of the high-heat-resistant insulating encapsulant 24 only to cover the periphery of the SiC diodes 5 as in this Embodiment, the high-heat-resistant insulating encapsulant that is difficult to form a thick film can be also made available.

FIG. 6 shows a case in which the Si switching elements 4 and SiC diodes 5 are mounted separately on the base plates 21 and base plate 22 and the insulating substrates 18 and 19, respectively; however this can be applied to other cases in which the Si switching elements 4 and SiC diodes 5 are mounted in such a way that the Si switching elements 4 and SiC diodes 5 are mounted on the same insulating substrates 2 installed on the same base plate 1, or they are mounted separately on the insulating substrates 18 and 19, although they are installed on the same base plate 1.

As described above, the high-heat-resistant insulating encapsulant 24 that covers the region where the SiC diodes 5 are arranged has a heat resistance higher than that of the low-heat-resistant insulating encapsulant 25 that covers the region where the Si switching elements 4 are arranged, so that the SiC diodes 5 can be operated up to high temperatures.

Incidentally, although all the embodiments have been explained using the SiC semiconductor for the diodes, the diodes only have to feature low power loss and high-temperature usability compared to the Si switching elements; therefore, other wide-bandgap semiconductor materials, such as gallium nitride and diamond, may be used for the diodes.

Description of the Reference Numerals

1: base plate
2: insulating substrates
3: conductive patterns
4: Si switching elements
5: SiC diodes
6, 20: wirings
7, 8: main electrode
9, 10: control terminal
11: case
12: insulating encapsulant
13, 14: main electrode anchoring point
15, 16: control terminal anchoring point
17: fixing holes
18: insulating substrates for switching elements
19: insulating substrates for diodes
21: base plates for switching elements
22: base plate for diodes
23: heat-resistant material
24: high-heat-resistant insulating encapsulant
25: low-heat-resistant insulating encapsulant
100, 200, 300, 400, 500: power semiconductor module

The invention claimed is:

1. A power semiconductor module comprising:
Si semiconductor switching elements; and
wide-bandgap semiconductor diode elements, wherein:
each of the wide-bandgap semiconductor diode elements has a bandgap that is wider than a bandgap of Si,
the wide-bandgap semiconductor diode elements are disposed only in a middle region of the power semiconductor module, and
the Si semiconductor switching elements are arranged only adjacent to both sides of the middle region and not in the middle region.

2. A power semiconductor module comprising:
Si semiconductor switching elements; and
wide-bandgap semiconductor diode elements, wherein each of the wide-bandgap semiconductor diode elements has a bandgap that is wider than a bandgap of Si, and the wide-bandgap semiconductor diode elements are disposed only in a single region of the power semiconductor module and sandwiched on at least two sides by a plurality of the Si semiconductor switching elements, and
the Si semiconductor switching elements are arranged only adjacent to both sides of the single region or only in a periphery of the power semiconductor module, and not in the single region.

3. A power semiconductor module according to claim 1, wherein the Si semiconductor elements are diodes and the wide-bandgap semiconductor elements are switching elements.

4. A power semiconductor module according to claim 1, further comprising plural insulating substrates,
wherein at least two of the Si semiconductor switching elements and at least two of the wide-bandgap semiconductor diode elements are mounted on each of the plural insulating substrates.

5. A power semiconductor module according to claim 1, wherein the Si semiconductor elements and the wide-bandgap semiconductor elements are mounted separately on their respective insulating substrates.

6. A power semiconductor module according to claim 2, wherein the Si semiconductor elements are diodes and the wide-bandgap semiconductor elements are switching elements.

7. A power semiconductor module according to claim 2, further comprising plural insulating substrates,
wherein at least two of the Si semiconductor switching elements and at least two of the wide-bandgap semiconductor diode elements are mounted on each of the plural insulating substrates.

8. A power semiconductor module according to claim 2, wherein the Si semiconductor elements and the wide-bandgap semiconductor elements are mounted separately on their respective insulating substrates.

9. A power semiconductor module according to claim 5, wherein an insulating substrate on which the Si semiconductor elements are mounted and another insulating substrate on which the wide-bandgap semiconductor elements are mounted are installed on the same base plate.

10. A power semiconductor module according to claim 5, wherein an insulating substrate on which the Si semiconductor elements are mounted and another insulating substrate on which the wide-bandgap semiconductor element are mounted are installed separately on their respective base plates.

11. A power semiconductor module according to claim 8, wherein an insulating substrate on which the Si semiconductor elements are mounted and another insulating substrate on which the wide-bandgap semiconductor elements are mounted are installed on the same base plate.

12. A power semiconductor module according to claim 8, wherein an insulating substrate on which the Si semiconductor elements are mounted and another insulating substrate on which the wide-bandgap semiconductor elements are mounted are installed separately on their respective base plates.

13. A power semiconductor module according to claim 1, wherein an insulating encapsulant that covers a region where the wide-bandgap semiconductor elements are arranged has a heat resistance higher than that of another insulating encapsulant that covers another region where the Si semiconductor elements are arranged.

14. A power semiconductor module according to claim 2, wherein an insulating encapsulant that covers a region where the wide-bandgap semiconductor elements are arranged has a heat resistance higher than that of another insulating encapsulant that covers another region where the Si semiconductor elements are arranged.

15. A power semiconductor module according to claim 1, wherein an insulating encapsulant that covers a region where the wide-bandgap semiconductor elements are arranged is formed of any one of fluorocarbon resin, polyimide, polyamide, epoxy and high-heat-resistant silicone resin, and another insulating encapsulant that covers another region where the Si semiconductor elements are arranged is formed of silicone gel or silicone rubber.

16. A power semiconductor module according to claim 2, wherein an insulating encapsulant that covers a region where the wide-bandgap semiconductor elements are arranged is formed of any one of fluorocarbon resin, polyimide, polyamide, epoxy and high-heat-resistant silicone resin, and another insulating encapsulant that covers another region where the Si semiconductor elements are arranged is formed of silicone gel or silicone rubber.

17. A power semiconductor module according to claim 1, wherein the wide-bandgap semiconductor elements are made of silicon carbide, gallium nitride material or diamond.

18. A power semiconductor module according to claim 2, wherein the wide-bandgap semiconductor elements are made of silicon carbide, gallium nitride material or diamond.

19. A power semiconductor module comprising:
Si semiconductor switching elements; and
wide-bandgap semiconductor diode elements,
wherein:
each of the wide-bandgap semiconductor diode elements has a bandgap that is wider than a bandgap of Si,
the wide-bandgap semiconductor diode elements are disposed only in a center region of the power semiconductor module which divides the power semiconductor module into a left side and a right side, and
the Si semiconductor switching elements are disposed only adjacent to both the left side and the right side of the power semiconductor module and not in the center region.

20. A power semiconductor module according to claim 1, wherein the Si semiconductor switching elements and the wide-bandgap semiconductor diode elements are covered with insulating sealant.

* * * * *